United States Patent
Lee

(10) Patent No.: US 7,825,043 B2
(45) Date of Patent: Nov. 2, 2010

(54) METHOD FOR FABRICATING CAPACITOR IN SEMICONDUCTOR DEVICE

(75) Inventor: Kee-Jeung Lee, Kyoungki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/478,175

(22) Filed: Jun. 28, 2006

(65) Prior Publication Data

US 2007/0122967 A1    May 31, 2007

(30) Foreign Application Priority Data

Nov. 28, 2005   (KR) .................... 10-2005-0114367

(51) Int. Cl.
*H01L 21/31* (2006.01)
*H01L 21/469* (2006.01)

(52) U.S. Cl. .................. 438/785; 438/216; 438/261; 438/387; 438/255; 438/398; 438/399; 257/E21.01; 257/E21.274; 257/E21.285; 257/E21.337; 257/E21.013; 257/E21.647; 257/E27.048; 257/310; 257/337; 257/410; 257/532; 257/647

(58) Field of Classification Search .............. 438/785, 438/216, 387, 261, 255, 398, 399; 257/E21.01, 257/E21.274, E21.285, E21.208, E21.337, 257/310, 410, E21.013, E21.647, 532, E27.048
See application file for complete search history.

(56) References Cited

U.S. PATENT DOCUMENTS

| | | | |
|---|---|---|---|
| 6,407,435 B1 | 6/2002 | Ma et al. |
| 6,570,253 B1 | 5/2003 | Lim et al. |
| 6,596,602 B2 | 7/2003 | Iizuka et al. |
| 6,603,169 B2 | 8/2003 | Lee |
| 6,627,503 B2 | 9/2003 | Ma et al. |
| 6,660,660 B2 | 12/2003 | Haukka et al. |
| 6,664,186 B1 | 12/2003 | Callegari et al. |
| 6,753,224 B1 | 6/2004 | Lin et al. |
| 6,774,050 B2 | 8/2004 | Ahn et al. |
| 6,787,863 B2 | 9/2004 | Nakajima |
| 6,797,525 B2 | 9/2004 | Green et al. |
| 6,815,285 B2 | 11/2004 | Choi et al. |
| 6,903,398 B2 | 6/2005 | Yamamoto |

(Continued)

FOREIGN PATENT DOCUMENTS

DE   102005053322 A1   6/2006

(Continued)

OTHER PUBLICATIONS

State Intellectual Property Office (SIPO) of China, English Translation of Office Action Issued for Chinese Patent Application No. 200610152307.9, 8 pages (Apr. 18, 2008).

*Primary Examiner*—Lynne A Gurley
*Assistant Examiner*—Meiya Li
(74) *Attorney, Agent, or Firm*—Townsend and Townsend and Crew LLP

(57) ABSTRACT

A method for fabricating a capacitor in a semiconductor device includes: forming a bottom electrode; forming a $Zr_xAl_yO_z$ dielectric layer on the bottom electrode using an atomic layer deposition (ALD) method, wherein the $Zr_xAl_yO_z$ dielectric layer comprises a zirconium (Zr) component, an aluminum (Al) component and an oxygen (O) component mixed in predetermined mole fractions of x, y and z, respectively; and forming a top electrode on the $Zr_xAl_yO_z$ dielectric layer.

22 Claims, 4 Drawing Sheets

U.S. PATENT DOCUMENTS

| | | | |
|---|---|---|---|
| 6,984,591 B1 * | 1/2006 | Buchanan et al. | 438/778 |
| 2002/0014647 A1 | 2/2002 | Seidl et al. | |
| 2002/0135048 A1 | 9/2002 | Ahn et al. | |
| 2002/0153579 A1 | 10/2002 | Yamamoto | |
| 2002/0168840 A1 * | 11/2002 | Hong et al. | 438/584 |
| 2002/0182851 A1 * | 12/2002 | Yeh et al. | 438/633 |
| 2002/0190294 A1 | 12/2002 | Iizuka et al. | |
| 2004/0104420 A1 | 6/2004 | Coolbaugh et al. | |
| 2004/0135186 A1 * | 7/2004 | Yamamoto | 257/296 |
| 2004/0141390 A1 | 7/2004 | Won et al. | |
| 2004/0235242 A1 | 11/2004 | Basceri et al. | |
| 2005/0051824 A1 | 3/2005 | Iizuka et al. | |
| 2005/0054156 A1 | 3/2005 | Bruley et al. | |
| 2005/0054165 A1 * | 3/2005 | Ahn et al. | 438/287 |
| 2005/0196917 A1 * | 9/2005 | Lian et al. | 438/240 |
| 2005/0212031 A1 | 9/2005 | Yamamoto | |
| 2006/0060929 A1 * | 3/2006 | Buh et al. | 257/408 |

FOREIGN PATENT DOCUMENTS

| | | |
|---|---|---|
| JP | 2002-060944 | 2/2002 |
| KR | 10-2002-0013189 A | 2/2002 |
| KR | 10-2004-0059536 A | 7/2004 |
| KR | 10-2004-0060443 A | 7/2004 |
| KR | 10-2005-0005726 A | 1/2005 |
| KR | 10-2005-0028749 A | 3/2005 |
| KR | 10-2005-0075790 | 8/2005 |
| KR | 10-2005-0079599 | 8/2005 |
| KR | 10-2005-0096375 A | 10/2005 |
| KR | 10-2005-0102202 | 10/2005 |
| KR | 10-2005-0103065 | 10/2005 |
| KR | 10-2005-0107399 | 11/2005 |
| KR | 10-2005-0123428 | 12/2005 |
| KR | 10-2006-0037895 A | 5/2006 |
| KR | 10-2006-0041355 A | 5/2006 |
| KR | 10-2006-0072338 A | 6/2006 |
| KR | 10-0596805 B1 | 6/2006 |
| KR | 10-0655139 B1 | 12/2006 |
| KR | 10-0655140 B1 | 12/2006 |
| KR | 10-0656283 B1 | 12/2006 |
| KR | 10-2007-0000707 A | 1/2007 |
| KR | 10-2007-0000759 A | 1/2007 |
| KR | 10-2007-0002579 A | 1/2007 |
| KR | 10-2007-0003031 A | 1/2007 |
| KR | 10-0670726 B1 | 1/2007 |
| KR | 10-0672766 B1 | 1/2007 |
| TW | I223329 | 11/2004 |
| TW | I240011 | 9/2005 |

* cited by examiner

METHOD FOR FABRICATING CAPACITOR IN SEMICONDUCTOR DEVICE

BACKGROUND

The present invention relates to a method for fabricating a semiconductor device; and more particularly, to a method for fabricating a capacitor in a semiconductor device.

As semiconductor devices such as DRAM become highly integrated, the unit cell size and operating voltage decrease. Thus, the device refresh time is often shortened, and a soft error can frequently occur. To overcome these limitations, capacitors need to be developed to have a capacitance of 25 fF per cell or higher and a reduced leakage current.

Generally, a capacitor formed in a structure of nitride and oxide (NO) using $Si_3N_4$ as a dielectric material is disadvantageous in capacitance when it comes to large scale integration. There is not enough area to obtain the required capacitance. Instead of using $Si_3N_4$, a capacitor structure that uses a high-K dielectric material (e.g., tantalum oxide ($Ta_2O_5$), lanthanum oxide ($La_2O_3$) or hafnium oxide ($HfO_2$)) in a single dielectric layer is developed to obtain sufficient capacitance. This particular capacitor structure is called a polysilicon-insulator-polysilicon (SIS) structure.

However, a SIS capacitor structure using an $Al_2O_3$ dielectric material may have capacitance limitations in 512M level or higher dynamic random access memories (DRAMs). Thus, many researchers are focused on developing other capacitor structures, such as a metal-insulator-metal (MIM) structure using a titanium nitride (TiN) electrode and an $HfO_2/Al_2O_3$ or $HfO_2/Al_2O_3/HfO_2$ dielectric structure.

When the aforementioned capacitor structure is used, the expected equivalent oxide thickness (Tox) is about 12 Å. To increase capacitance without reducing oxide thickness, capacitor area can be increased with a 3D electrode structure. In DRAM products with sub-70 nm level metal interconnection technology, obtaining cell capacitance of about 25 fF/cell or higher may result in a complex bottom electrode structure. Accordingly, it may be difficult to obtain the desired capacitance if the area of the bottom electrode structure is not enlarged.

Recently, many studies on MIM capacitor structures have made progress. These MIM capacitor structures use a noble metal, e.g., ruthenium (Ru), as an electrode material and $Ta_2O_5$ or $HfO_2$ as a single dielectric material.

However, if the equivalent oxide thickness is decreased to about 12 Å or less along with using the Ru electrode, the MIM capacitor is likely to have a high leakage current; about 1 fA per cell in some instances. Accordingly, it may be difficult to implement this MIM capacitor in DRAM with 512M or higher capacity that uses sub-70 nm level interconnection technology.

SUMMARY OF THE INVENTION

An embodiment of the present invention relates to a method for fabricating a capacitor in a semiconductor device, where the leakage current is reduced and capacitance increased for DRAM products implemented with sub-70 nm level interconnection technology.

In accordance with an embodiment of the present invention, there is provided a method for fabricating a capacitor in a semiconductor device, including: forming a bottom electrode; forming a $Zr_xAl_yO_z$ dielectric layer on the bottom electrode using an atomic layer deposition (ALD) method, wherein the $Zr_xAl_yO_z$ dielectric layer comprises a zirconium (Zr) component, an aluminum (Al) component and an oxygen (O) component mixed in predetermined mole fractions of x, y and z, respectively; and forming a top electrode on the $Zr_xAl_yO_z$ dielectric layer.

DETAILED DESCRIPTION OF THE INVENTION

Figure 1:
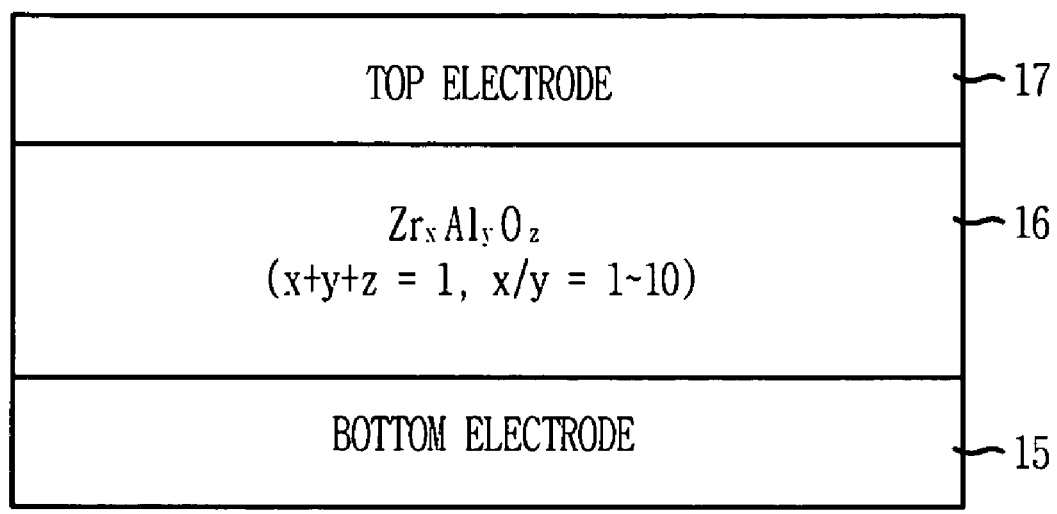
FIG. 1 is a diagram illustrating a capacitor structure in accordance with an embodiment of the present invention.

Specific embodiments of the present invention will be described in detail with reference to the accompanying drawings, where like reference numerals denote like elements in different drawings.

Referring to FIG. 1, a $Zr_xAl_yO_z$ dielectric layer 16 and a top electrode 17 are sequentially formed on a bottom electrode 15. The $Zr_xAl_yO_z$ dielectric layer 16 contains controlled mole fractions of zirconium (Zr), aluminum (Al) and oxygen (O). Also, the $Zr_xAl_yO_z$ dielectric layer 16 is formed using an atomic layer deposition (ALD) method to an approximate thickness between 50 Å and 100 Å.

In the $Zr_xAl_yO_z$ dielectric layer 16, the subscripts x, y and z in "$Zr_xAl_yO_z$" represent mole fractions of Zr, Al and O, respectively. When added together (i.e., x+y+z) these mole fractions come to approximately 1. Also, the ratio of x to y is in an approximate range between 1:1 and 10:1. This ratio indicates that the mole fraction of the Zr component in the $Zr_xAl_yO_z$ dielectric layer 16 can range from being equal to the Al component to being 10 times greater than the Al component.

Figure 2A:
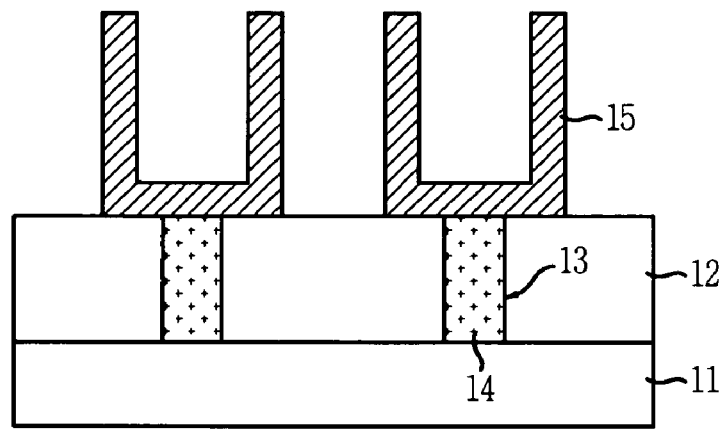
FIGS. 2A to 2C are cross-sectional views illustrating a method for fabricating a capacitor in a semiconductor device in accordance with an embodiment of the present invention.

Referring to FIG. 2A, an inter-layer insulation layer 12 is formed over a substrate 11 in which bottom structures including bit lines and transistors are already formed. The inter-layer insulation layer 12 is etched to form contact holes 13 exposing the junction regions of the substrate 11 or the landing plug polys (LPPs). A conductive material fills the contact holes 13 to form storage node contacts 14.

A bottom electrode material is formed over the inter-layer insulation layer 14 and the storage node contacts 14. Then a chemical mechanical polishing (CMP) process or an etch-back process is performed on the bottom electrode material to isolate and create each bottom electrode 15 contacting a storage node contact 14.

The bottom electrodes 15 include a metal-based material consisting of either titanium nitride (TiN), tantalum nitride (TaN), tungsten (W), tungsten nitride (WN), ruthenium (Ru), ruthenium oxide ($RuO_2$), iridium (Ir), iridium oxide ($IrO_2$), or platinum (Pt). Also, the bottom electrodes 15 are formed to a thickness ranging from approximately 200 Å to 500 Å. In addition to a cylindrical structure as illustrated in FIG. 2A, the bottom electrodes 15 can be formed in another structure such as a concave structure or a stacked structure.

As an example, if the bottom electrodes 15 use TiN, $TiCl_4$ is used as a source material and $NH_3$ as a reaction gas. The source material and the reaction gas are provided individually at a rate ranging from approximately 10 sccm to 1,000 sccm. At this time, the reaction chamber is maintained at approximately 0.1 Torr to 10 Torr, and the substrate 11 is maintained at approximately 500° C. to 700° C. The bottom electrodes 15 (i.e., the TiN layer) are formed to a thickness ranging from approximately 200 Å to 500 Å.

After the formation of the bottom electrodes 15, an annealing process is performed in an ambient gas selected from the group consisting of nitrogen ($N_2$), hydrogen ($H_2$), $N_2/H_2$, oxygen ($O_2$), ozone ($O_3$), and ammonia ($NH_3$). The annealing process is performed to densify the bottom electrodes 15; remove remnant impurities in the bottom electrodes 15, which often cause leakage current to increase; and to eliminate surface roughness, which may cause an uneven electric field distribution.

The annealing process is performed using either a plasma annealing process, a furnace annealing process, or a rapid thermal process (RTP). The plasma annealing process is performed for approximately 1 to 5 minutes under the following conditions: radio frequency (RF) power at approximately 100 W to 500 W to generate a plasma; temperature at approximately 200° C. to 500° C.; pressure at approximately 0.1 Torr to 10 Torr; and the selected ambient gas of approximately 5 sccm to 5,000 sccm. The furnace annealing process is performed at approximately 600° C. to 800° C. using approximately 5 sccm to 5,000 sccm of the selected ambient gas. The RTP is performed using approximately 5 sccm to 5,000 sccm of the selected ambient gas in a chamber maintained in an ascending pressure of approximately 700 Torr to 760 Torr or a descending pressure of approximately 1 Torr to 100 Torr at a temperature of approximately 500° C. to 800° C.

Figure 2B:
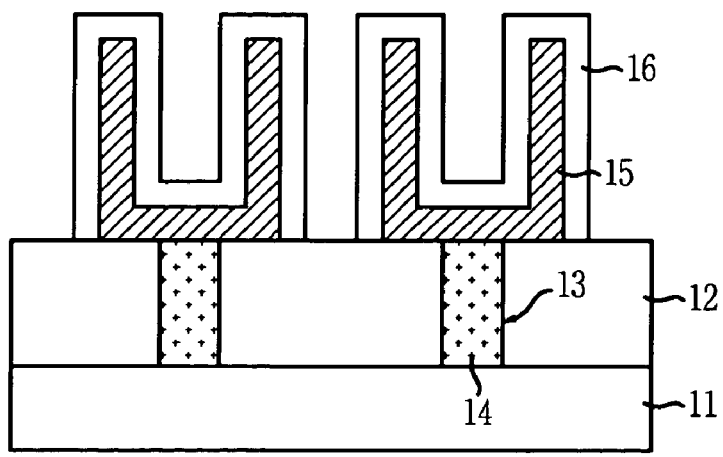

Referring to FIG. 2B, a $Zr_xAl_yO_z$ dielectric layer 16 is formed over the bottom electrodes 15. A thin zirconium oxide ($ZrO_2$) film and a thin aluminum oxide ($Al_2O_3$) film are mixed together to form the $Zr_xAl_yO_z$ dielectric layer 16. Particularly, the $Zr_xAl_yO_z$ dielectric layer 16 is obtained by performing an atomic layer deposition (ALD) method, which will be described in detail with reference to FIG. 3.

Figure 2C:
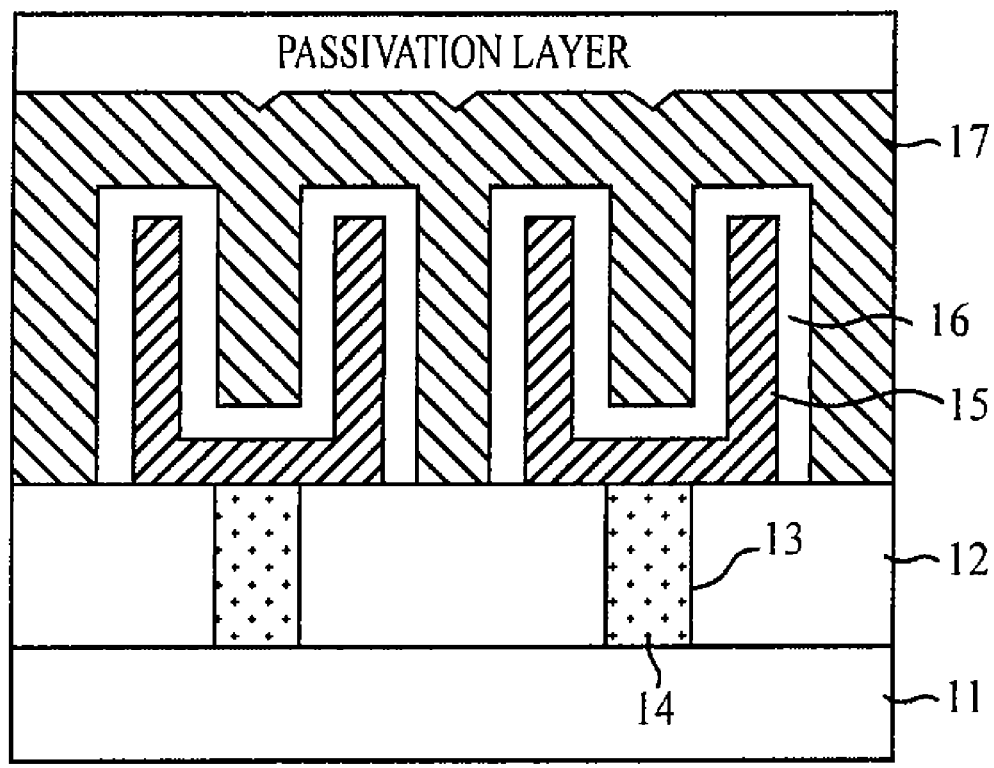

Referring to FIG. 2C, a top electrode 17 is formed over the $Zr_xAl_yO_z$ dielectric layer 16. The top electrode 17 includes TiN, TaN, W, WN, Ru, $RuO_2$, Ir, $IrO_2$, or Pt. The illustrated capacitor structure is a MIM capacitor structure.

As an example, the top electrode 17 may be a layer of TiN obtained by performing a chemical vapor deposition (CVD) or a physical vapor deposition (PVD). For the CVD method, $TiCl_4$ and $NH_3$ are used as the source material and reaction gas, respectively. The source material and reaction gas are supplied individually at a rate ranging from approximately 10 sccm to 1,000 sccm. At this time, the reaction chamber is maintained at approximately 0.1 Torr to 10 Torr, and the substrate temperature ranges from approximately 500° C. to 600° C. The TiN layer (i.e., the top electrode 17) is formed to a thickness of 200 Å to 400 Å.

Afterwards, an oxide layer or a metal layer may be formed to a thickness of approximately 50 Å to 200 Å. The oxide layer is formed by performing an ALD method and may include a material such as $Al_2O_3$, $HfO_2$, $Ta_2O_5$, $ZrO_2$, $TiO_2$, or $La_2O_3$, and the metal layer may include TiN. The oxide layer or the metal layer is formed as a passivation layer or a buffer layer to improve structural stability against humidity; temperature or electric shocks, which may be generated while a thermal process and a curing process of a subsequent integration process (i.e., a back end process); a wet etching process; a packaging process; and environmental tests for reliability are carried out. For reference, the thermal process and the curing process are performed in an ambient gas such as $H_2$, $N_2$, or $N_2/H_2$.

Figure 3:
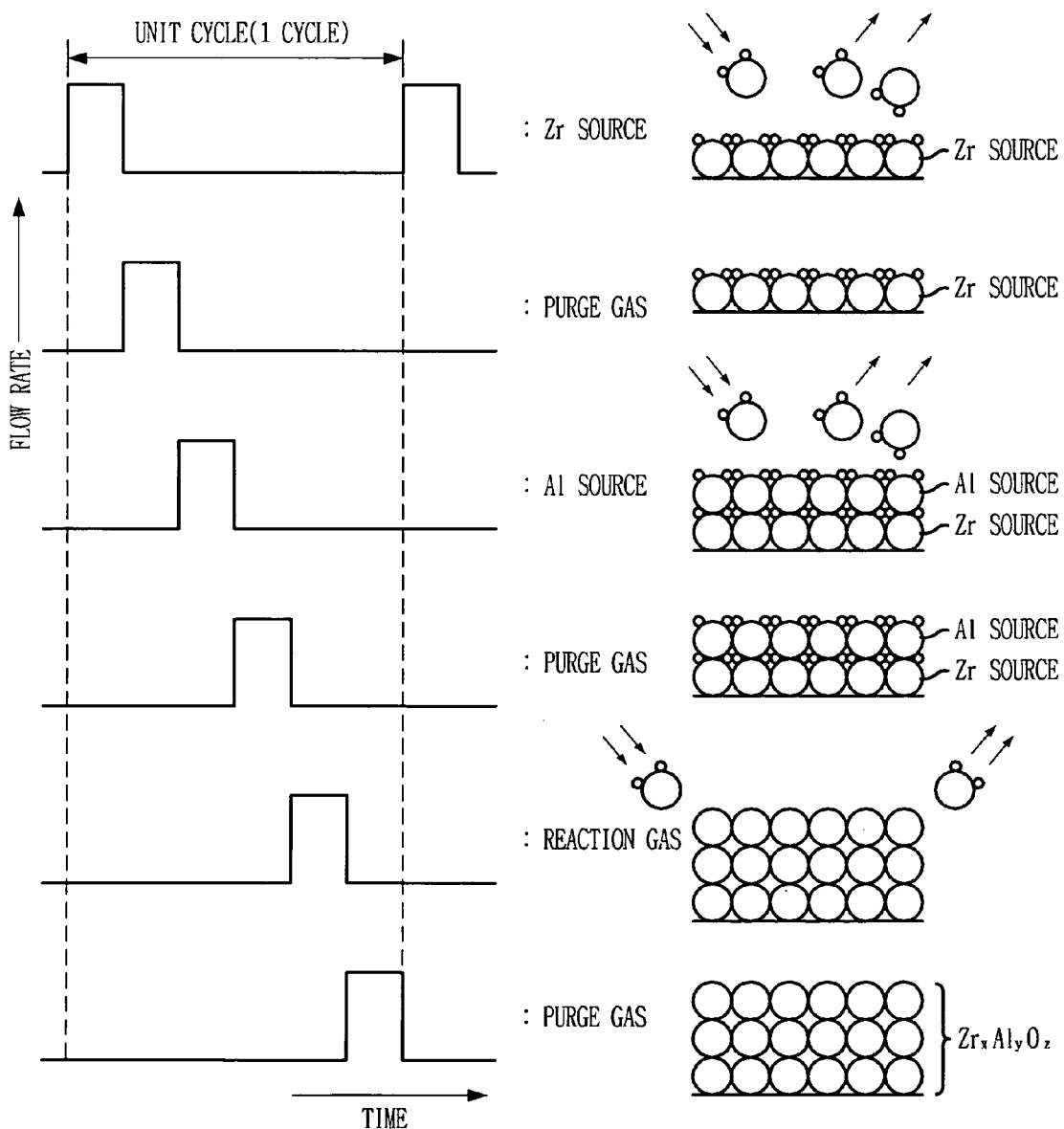
FIG. 3 is a diagram for describing sequential operations of forming a $Zr_xAl_yO_z$ dielectric layer based on an atomic layer deposition (ALD) method in accordance with an embodiment of the present invention.

FIG. 3 is a diagram for describing the processes performed in forming a $Zr_xAl_yO_z$ dielectric layer based on an ALD method in accordance with an embodiment of the present invention.

As illustrated, the ALD method includes supplying a source gas, purging out non-reacted parts of the source gas, supplying a reaction gas, and purging out non-reacted parts of the reaction gas. The ALD method is performed repeatedly until the $Zr_xAl_yO_z$ dielectric layer is formed to an intended thickness.

In more detail, the source gas is supplied for adsorption into a target, and the purge gas is supplied to purge out excess source gas that was not adsorbed. Then, the reaction gas is supplied and reacts with the adsorbed source gas to deposit the desired thin layer. The purge gas is then supplied again to purge out non-reacted parts of the reaction gas.

The $Zr_xAl_yO_z$ dielectric layer is obtained by performing the aforementioned unit cycle of the ALD method, including supplying a Zr source gas, an Al source gas, supplying a purge gas, supplying a reaction gas, and supplying the purge gas again. The unit cycle is repeated until the thickness of the $Zr_xAl_yO_z$ dielectric layer ranges from approximately 50 Å to 100 Å. At this point, the substrate is maintained at approximately 200° C. to 500° C., and the reaction chamber is maintained at approximately 0.1 Torr to 1 Torr.

The Zr source gas is selected from $ZrCl_4$, $Zr(N(CH_3)C_2H_5)_4$, $Zr(O-tBu)_4$, $Zr(N(CH_3)_2)_4$, $Zr(N(C_2H_5)(CH_3))_4$, $Zr(N(C_2H_5)_2)_4$, $Zr(TMHD)_4$, $Zr(OiC_3H_7)_3(TMTD)$, $Zr(OtBu)_4$, or a Zr containing compound. The Zr source gas is supplied into the reaction chamber by a carrier gas, e.g., argon (Ar) gas, which is supplied at a rate ranging from approximately 150 sccm to 250 sccm for approximately 0.1 seconds to 10 seconds.

The purge gas such as $N_2$ or Ar is supplied to purge out non-adsorbed parts of the Zr source gas. The purge gas is supplied at a rate ranging from approximately 200 sccm to 400 sccm for approximately 3 seconds to 10 seconds.

The Al source gas is selected from $Al(CH_3)_3$, $Al(C_2H_5)_3$ or an Al containing compound. The Al source gas is supplied into the reaction chamber with a carrier gas, e.g., Ar gas. The Ar gas is supplied at a rate ranging from approximately 20 sccm to 100 sccm for approximately 0.1 seconds to 5 seconds.

The purge gas, e.g., $N_2$ or Ar gas, is supplied again to purge out non-reacted parts of the Al source gas. The purge gas is supplied at a rate ranging from approximately 200 sccm to 400 sccm for approximately 3 seconds to 10 seconds.

The reaction gas is selected from either $O_3$ (with a concentration of approximately 100 $g/m^3$ to 500 $g/m^3$), $O_2$, $O_2$ plasma, $N_2O$, $N_2O$ plasma, or water vapor. The reaction gas reacts with the Zr source gas and the Al source gas to form the $Zr_xAl_yO_z$ dielectric layer. The reaction gas is supplied at a rate ranging from approximately 100 sccm to 1,000 sccm for approximately 3 seconds to 10 seconds.

The purge gas, e.g., $N_2$ gas or Ar gas, is supplied into the chamber to purge out non-reacted parts of the reaction gas remaining inside the chamber. The purge gas is supplied at a rate ranging from approximately 50 sccm to 200 sccm for approximately 3 seconds to 10 seconds.

The above unit cycle of the ALD method is repeatedly performed until the $Zr_xAl_yO_z$ dielectric layer reaches a thickness of approximately 50 Å to 100 Å.

After the $Zr_xAl_yO_z$ dielectric layer is formed, an annealing process is performed in an ambient gas selected from the group consisting of $N_2$, $H_2$, $N_2/H_2$, $O_2$, $O_3$, and $NH_3$. The annealing process is performed to densify the $Zr_xAl_yO_z$ dielectric layer; obtain uniformity of the $Zr_xAl_yO_z$ dielectric layer; or to volatize the remaining impurities, which can cause a leakage current. The annealing process is also performed to reduce the surface roughness of other dielectric layers and remove crystallites.

The annealing process involves a plasma annealing process, a furnace annealing process or a RTP. The plasma annealing process is performed for approximately 1 minute to 5 minutes under the following conditions: radio frequency (RF) power at approximately 100 W to 500 W to generate a plasma; temperature at approximately 200° C. to 500° C.; pressure at approximately 0.1 Torr to 10 Torr; and the selected ambient gas at approximately 5 sccm to 5,000 sccm. The furnace annealing process is performed at approximately 600° C. to 800° C. using approximately 5 sccm to 5,000 sccm of the selected ambient gas. The RTP is performed using approximately 5 sccm to 5,000 sccm of the ambient gas in a chamber maintained in an ascending pressure of approximately 700 Torr to 760 Torr or a descending pressure of approximately 1 Torr to 100 Torr at approximately 500° C. to 800° C. The furnace annealing process and the RTP further increases the dielectric constant of the $Zr_xAl_yO_z$ dielectric layer.

According to the embodiments of the present invention, the $Zr_xAl_yO_z$ layer is used as the dielectric material of a capacitor, and this approach achieves required capacitance (e.g., approximately 25 fF per cell) in sub-70 nm level DRAM capacitors; required leakage current (e.g., approximately 0.5 fF per cell or less); and required breakdown voltage (e.g., approximately 2.0 V (at 1 pA per cell) or higher).

Generally, a thin $ZrO_2$ layer has higher band gap energy (Eg) and dielectric constant ($\epsilon$) than a thin $Ta_2O_5$ layer and a thin $HfO_2$ layer. For reference, the thin $ZrO_2$ layer has a band gap energy of approximately 7.8 eV and a dielectric constant ($\epsilon$) of approximately 20 to 25; the thin $Ta_2O_5$ layer has band gap energy of approximately 4.5 eV and a dielectric constant of approximately 25, and the thin $HfO_2$ layer has a band gap energy of approximately 5.7 eV and a dielectric constant of approximately 20. A thin $Al_2O_3$ layer, which has a band gap energy of approximately 8.7 eV and a dielectric constant of approximately 9, has better thermal stability than the thin $HfO_2$ layer. Based on these facts, the $Zr_xAl_yO_z$ dielectric layer can improve limitations in leakage current and thermal stability compared with the single dielectric structure of the capacitor, since the $Zr_xAl_yO_z$ dielectric layer has the characteristics of the thin $ZrO_2$ layer and the thin $Al_2O_3$ layer.

As a result, the thickness of the equivalent oxide layer of the $Zr_xAl_yO_z$ dielectric layer can be decreased to approximately 12 Å or less. Hence, the capacitor with the $Zr_xAl_yO_z$ dielectric layer can obtain a high capacitance of approximately 30 fF per cell or higher in sub-70 nm DRAM products. Also, as mentioned above, the capacitor according to the embodiments of the present invention can lower leakage current and desired breakdown voltage, thus enabling mass production.

In addition, since the $Zr_xAl_yO_z$ dielectric layer has better thermal stability than the single dielectric layer such as $HfO_2$, electric characteristics are less likely to be degraded during a high thermal process performed in an integration process after the formation of the capacitor. Accordingly, durability and reliability of the capacitor can be improved in next generation memory devices implemented with sub-70 nm semiconductor technology (e.g., a metal interconnection process).

The present application contains subject matter related to the Korean patent application No. KR 2005-0114367, filed in the Korean Patent Office on Nov. 28, 2005, the entire contents of which being incorporated herein by reference.

While the present invention has been described with respect to certain embodiments, it will be apparent to those skilled in the art that various changes and modifications may be made without departing from the spirit and scope of the invention as defined in the following claims.

What is claimed is:

1. A method for fabricating a capacitor in a semiconductor device, the method comprising:
   forming a bottom electrode of the capacitor over a semiconductor substrate, the bottom electrode having a non-planar shape;
   forming a $Zr_xAl_yO_z$ dielectric layer over the bottom electrode using an atomic layer deposition (ALD) method, wherein the $Zr_xAl_yO_z$ dielectric layer comprises a zirconium (Zr) component, an aluminum (Al) component and an oxygen (O) component mixed in predetermined mole fractions of x, y and z, respectively, the non-planar shape of the bottom electrode providing an increased contact area between the $Zr_xAl_yO_z$ dielectric layer and the bottom electrode; and
   forming a top electrode of the capacitor over the $Zr_xAl_yO_z$ dielectric layer,
   wherein the sum of the mole fractions of x, y and z in the $Zr_xAl_yO_z$ dielectric layer is approximately 1,
   wherein a ratio of the mole fraction of the Zr component (x) to the mole fraction of the Al component (y) is in a range of approximately 1:1 to 10:1, and
   wherein the forming of the $Zr_xAl_yO_z$ dielectric layer consists of the following sequence step:
      supplying a Zr source gas to enable Zr to be adsorbed on the bottom electrode,
      supplying a first purge gas to purge out non-adsorbed parts of the Zr source gas,
      supplying an Al source gas to enable Al to be adsorbed onto the Zr provided on the bottom electrode,
      supplying a second purge gas to purge out non-adsorbed parts of the Al source gas,
      supplying a reaction gas to react with the Zr and Al source gases provided on the target, thereby forming the $Zr_xAl_yO_z$ dielectric layer, wherein the reaction gas comprises an oxide gas, and
      supplying a third purge gas to remove non-reacted parts of the reaction gas.

2. The method of claim 1, wherein the Zr source gas includes one selected from the group consisting of $ZrCl_4$, $Zr(N(CH_3)C_2H_5)_4$, $Zr(O\text{-}tBu)_4$, $Zr(N(CH_3)_2)_4$, $Zr(N(C_2H_5)(CH_3))_4$, $Zr(N(C_2H_5)_2)_4$, $Zr(TMHD)_4$, $Zr(OiC_3H_7)_3$ (TMTD), $Zr(OtBu)_4$, and a Zr containing compound.

3. The method of claim 1, wherein the Al source gas includes one selected from the group consisting of $Al(CH_3)_3$, $Al(C_2H_5)_3$ and an Al containing compound.

4. The method of claim 1, wherein the oxide gas includes one selected from the group consisting of $O_3$ with a concentration of approximately 100 gm$^{-3}$ to approximately 500 gm$^{-3}$, $O_2$, $O_2$ plasma, $N_2O$, $N_2O$ plasma, and $H_2O$ vapor, wherein the reaction gas is supplied at a flow rate ranging from approximately 100 sccm to approximately 1,000 sccm for approximately 3 seconds to approximately 10 seconds.

5. The method of claim 1, wherein the first, second and third purge gases include one of $N_2$ gas and Ar gas.

6. The method of claim 1, wherein the $Zr_xAl_yO_z$ dielectric layer is formed to a thickness ranging from approximately 50 Å to approximately 100 Å.

7. The method of claim 1, wherein the $Zr_xAl_yO_z$ dielectric layer is formed under conditions of a substrate temperature ranging from approximately 200° C. to approximately 500° C. and a chamber pressure ranging from approximately 0.1 torr to approximately 1 torr.

8. The method of claim 1, further comprising performing an annealing process after the forming of the $Zr_xAl_yO_z$ dielectric layer.

9. The method of claim 8, wherein the annealing process proceeds with a plasma annealing process performed for approximately 1 minute to approximately 5 minutes under conditions of: an ambient gas including one selected from the group consisting of $N_2$, $H_2$, $N_2/H_2$, $NH_3N_2O$, $N_2/O_2$, $O_2$, and $O_3$ and supplied at a flow rate ranging from approximately 5 sccm to approximately 5,000 sccm; a temperature ranging from approximately 200° C. to approximately 500° C.; a plasma generated with radio frequency power ranging from approximately 100 W to approximately 500 W; and a pressure of approximately 0.1 torr to approximately 1 torr.

10. The method of claim 8, wherein the annealing process proceeds with a rapid thermal process performed under conditions of: a temperature ranging from approximately 500° C. to approximately 800° C.; one of an ascending chamber pressure ranging from approximately 700 torr to approximately 760 torr and a descending pressure ranging from approximately 1 torr to approximately 100 torr; and a gas selected from the group consisting of $N_2$, $H_2$, $N_2/H_2$, $NH_3$, $N_2O$, $N_2/O_2$, $O_2$, and $O_3$ and supplied at a flow rate ranging from approximately 5 sccm to approximately 5,000 sccm.

11. The method of claim 8, wherein the annealing process proceeds with a furnace annealing process performed under conditions of: a gas selected from the group consisting of $N_2$, $H_2$, $N_2/H_2$, $NH_3$, $N_2O$, $N_2/O_2$, $O_2$, and $O_3$ and supplied at a flow rate ranging from approximately 5 sccm to approximately 5,000 sccm; and a temperature ranging from approximately 600° C. to approximately 800° C.

12. The method of claim 1, wherein the bottom electrode and the top electrode include one selected from the group consisting of TiN, TaN, W, WN, Ru, $RuO_2$, Ir, $IrO_2$, and Pt.

13. The method of claim 1, further comprising, annealing the bottom electrode to densify the bottom electrode, the annealing being performed in an ambient gas selected from the group consisting of $N_2$, $H_2$, $N_2/H_2$, $O_2$, $O_3$, and $NH_3$, wherein the $Zr_xAl_yO_z$ dielectric layer is formed over the bottom electrode after the bottom electrode has been annealed.

14. The method of claim 1, further comprising, after the forming of the top electrode, forming a passivation layer over the top electrode using an ALD method.

15. The method of claim 14, wherein the passivation layer is formed to a thickness ranging from approximately 50 Å to approximately 200 Å.

16. The method of claim 14, wherein the passivation layer includes one of an oxide-based material and a metal-based material.

17. The method of claim 16, wherein the oxide-based material includes one selected from the group consisting of $Al_2O_3$, $HfO_2$, $Ta_2O_5$, $ZrO_2$, $TiO_2$, and $La_2O_3$.

18. The method of claim 16, wherein the metal-based material includes TiN.

19. The method of claim 13, further comprising:
annealing the $Zr_xAl_yO_z$ dielectric layer prior to forming the top electrode.

20. The method of claim 19, wherein the $Zr_xAl_yO_z$ dielectric layer is performed in an environment including oxygen.

21. The method of claim 1, wherein the $Zr_xAl_yO_z$ dielectric layer is formed to a thickness of about 50 Å.

22. The method of claim 8, wherein the annealing process is performed under an environment including oxygen.

* * * * *